(12) United States Patent
Guillaume et al.

(10) Patent No.: US 11,581,743 B2
(45) Date of Patent: *Feb. 14, 2023

(54) METHOD FOR STARTING A HYDRAULIC TURBINE

(71) Applicant: GE Renewable Technologies, Grenoble (FR)

(72) Inventors: Renaud Guillaume, Grenoble (FR); Quentin Alloin, Grenoble (FR); Olivier Teller, Grenoble (FR)

(73) Assignee: GE Renewable Technologies, Grenoble (FR)

( * ) Notice: Subject to any disclaimer, the term of this patent is extended or adjusted under 35 U.S.C. 154(b) by 0 days.

This patent is subject to a terminal disclaimer.

(21) Appl. No.: 17/465,255

(22) Filed: Sep. 2, 2021

(65) Prior Publication Data
US 2021/0399552 A1 Dec. 23, 2021

Related U.S. Application Data

(63) Continuation of application No. 16/665,385, filed on Oct. 28, 2019, now Pat. No. 11,114,863.

(30) Foreign Application Priority Data

Oct. 29, 2018 (EP) .................. 18306412

(51) Int. Cl.
*H02J 3/44* (2006.01)
*F03B 13/00* (2006.01)
(Continued)

(52) U.S. Cl.
CPC ............ *H02J 3/44* (2013.01); *F03B 13/00* (2013.01); *G01R 31/343* (2013.01); *H02J 3/381* (2013.01);
(Continued)

(58) Field of Classification Search
CPC .. H02J 3/44; H02J 3/381; H02K 19/36; F03B 13/00
See application file for complete search history.

(56) References Cited

U.S. PATENT DOCUMENTS

| 4,087,698 A | 5/1978 | Myers |
| 5,418,446 A | 5/1995 | Hallidy |
| (Continued) | | |

FOREIGN PATENT DOCUMENTS

| CN | 103138290 B | 12/2014 | |
| EP | 2481917 A1 * | 8/2012 | .............. F03D 11/02 |
| (Continued) | | | |

OTHER PUBLICATIONS

Mesnage et al., Constrained Model Based Control for Minimum-time Start of Hydraulic Turbines, IOP Conference Series: Earth and Environmental Science, IOP Publishing, vol. 49, Nov. 2016, 052009, DOI: 10.1088/1755-1315/49/5/052009.

*Primary Examiner* — Sean Gugger
(74) *Attorney, Agent, or Firm* — Dority & Manning, P.A.

(57) ABSTRACT

The invention concerns a method for coupling to the grid a hydraulic unit having a synchronous generator, a runner, and wicket gates. The method includes a step of increasing the flow of water into the runner from a time $t_0$ to a time $t_1$ so that the rotation frequency of the rotor of the synchronous generator is, at time $t_1$ equal to the frequency of the grid, and closing the circuit breaker at time $t_1$. A sub-interval from a time t2 to time t1 is defined, with t0<=t2<t3<=t1, wherein a sub-step is executed to apply an adjustment torque to the shaft line via a first actuator that controls the flow of water into the runner and a second actuator coupled to a stator of the synchronous generator.

18 Claims, 4 Drawing Sheets

(51) Int. Cl.
*G01R 31/34* (2020.01)
*H02J 3/38* (2006.01)
*H02K 19/36* (2006.01)

(52) U.S. Cl.
CPC .......... *H02K 19/36* (2013.01); *F05B 2220/32* (2013.01); *F05B 2220/70642* (2013.01); *F05B 2260/85* (2013.01); *F05B 2270/337* (2013.01); *H02J 2203/20* (2020.01)

(56) References Cited

U.S. PATENT DOCUMENTS

| | | |
|---|---|---|
| 6,005,786 A | 12/1999 | Bluemel et al. |
| 2004/0212353 A1 | 10/2004 | Nelson |
| 2004/0224820 A1 | 11/2004 | Matsumura et al. |
| 2005/0037891 A1 | 2/2005 | Shishido et al. |
| 2009/0322086 A1 | 12/2009 | Letas |
| 2011/0163607 A1 | 7/2011 | Schuette et al. |
| 2011/0221191 A1 | 9/2011 | Fiset et al. |
| 2012/0274066 A1 | 11/2012 | Montgomeiy |
| 2014/0043080 A1 | 2/2014 | Larsen |
| 2014/0361540 A1 | 12/2014 | Knight |
| 2014/0366546 A1 | 12/2014 | Bruno et al. |
| 2015/0280480 A1 | 10/2015 | Mitri et al. |
| 2016/0285400 A1 | 9/2016 | Yuan et al. |
| 2017/0138213 A1 | 5/2017 | Olatunde |
| 2017/0226989 A1 | 8/2017 | Hammerum et al. |
| 2018/0375456 A1 | 12/2018 | Huh et al. |
| 2019/0027939 A1 | 1/2019 | Kleen et al. |
| 2019/0390565 A1 | 12/2019 | Nowoisky et al. |
| 2020/0056588 A1 | 2/2020 | Nielsen |

FOREIGN PATENT DOCUMENTS

| | | |
|---|---|---|
| EP | 2481917 A1 | 8/2012 |
| EP | 3171020 A1 | 5/2017 |

* cited by examiner

METHOD FOR STARTING A HYDRAULIC TURBINE

RELATED APPLICATIONS

The present application is a Continuation Application from U.S. application Ser. No. 16/665,385, filed Oct. 28, 2019, which claims priority to EP Application No. 18306412.0, filed Oct. 29, 2018.

TECHNICAL FIELD

The invention relates to a method for coupling a hydraulic turbine to the grid. In particular, the invention relates to a method for coupling to the grid a hydraulic turbine which comprises a synchronous generator whose rotor is driven in rotation by a turbine. The present invention is further intended to propose a method for coupling a hydraulic turbine to the grid in faster way than prior art methods.

PRIOR ART

In order to ensure a grid stability and/or to prevent a network blackout, a grid balancing between the electrical power production and the electrical power consumption must be achieved.

Hydroelectric power plants have an electrical power reserve, via water reserves contained in a reservoir that can be provided upon demand by starting a hydraulic turbine in order to compensate any variation of the consumption and/or the production of the electrical power.

To this regard, the time response for providing such an electrical power reserve is thus a critical factor, on the basis of which the electricity producer can expect a more or less advantageous remuneration.

A known prior art method for starting a hydraulic turbine having a synchronous generator connected to a grid via a circuit breaker, a runner to drive the synchronous generator, and guide vanes for adjusting a flow of water running into the runner, comprises the following steps:

a) Opening the guide vanes (wicket gates) to pass the flow of water in the runner and bring the runner speed up to a rated speed;

b) Circulating an excitation current in the rotor windings in order to energize the synchronous generator;

c) Adjusting the guide vanes to stabilize the runner speed at a value close to a nominal speed which corresponds to the frequency of the grid;

d) Aligning the phases of the grid with the phases of the synchronous generator;

e) Closing the circuit breaker to connect the stator winding to the grid.

However, this method is not satisfactory.

Indeed, the minimum time response for starting a hydraulic turbine is about 90 seconds, which is not compatible with the maximum efficiency that could be expected in terms of revenues.

For example, steps c) and d), which taken together form a more general step called "synchronization step", generally take 20 s to 60 s. The control of the unit speed is indeed very difficult due to both the transient behavior of the hydraulic circuit and the difficulty to control slightly the water flow with the distributor.

Therefore, to keep the time response of the hydraulic unit starting as low as possible, it has been proposed to maintain said unit synchronized to the grid at very low power.

However, this solution is also not satisfactory.

Indeed, when synchronized at very low or zero power, the hydraulic unit consumes water reserves while operating at very low efficiency.

Besides, turbines and synchronous generators, which are generally not designed to operate at low power, then undergo abnormal wear.

It is possible to operate at higher power but such additional power, even if not needed, has to be managed by the grid operator and is sold at a very low price.

Alternatively, the hydraulic unit can be kept synchronized to the grid in a dewatered mode.

However, the alternative is also not satisfactory.

Indeed, the dewatered mode requires specific investments for flushing the water from the hydraulic turbine, which increase the cost of the installation.

Furthermore, in dewatered mode, the hydraulic unit consumes electrical power form the grid.

It is therefore an object of the invention to propose a method for coupling a hydraulic unit to the grid in a faster way than known prior art method.

It is also an object of the invention to propose a method for coupling the hydraulic turbine to the grid that does not require any additional investments.

It is also an object of the invention to propose a method for coupling the hydraulic unit to the grid that does not consume neither water reserves nor grid electrical power.

SUMMARY OF THE INVENTION

The aforementioned objects are, at least partly, achieved by a method for controlling, advantageously starting, a hydraulic unit having a synchronous generator intended to be connected to a grid via a circuit breaker, a hydraulic turbine provided with a runner mechanically coupled to the rotor of the synchronous generator via a shaft line to drive the synchronous generator, and means for adjusting a torque to the shaft line, the method comprises:

a) a step of adjusting, advantageously increasing, the flow of water into the runner from a time $t_0$ to a time $t_1$;

b) a step of closing the circuit breaker at time $t_1$, $t_1$ being a time for which the rotation speed of the rotor of the synchronous generator is equal to the synchronous speed within a first tolerance interval and the grid phase and the synchronous generator phase are aligned within a second tolerance interval, the step a) comprises a sub-step a1) executed from a time $t_2$ to time $t_1$, wherein an adjustment torque, calculated with a controller called adjustment controller, is applied to the shaft line so that, at a time $t_3$, for which the generator rotation speed enters for the first time within the first tolerance interval, the difference between the synchronous generator phase and the grid phase, is equal to a predetermined value A within a third tolerance interval, time $t_1$ being the nearest time with respect to time $t_3$ for which the grid phase and the synchronous generator phase are aligned within the second tolerance interval.

The method may advantageously be used for starting the hydraulic turbine. The method may also be used when a reversible turbine changes from a pumping mode to a turbine mode. The method may also be used to couple the turbine back to the grid after a default causes a disconnection of the turbine from the grid.

According to one embodiment, the predetermined value A is in the range [0°, 270°], preferably [0°, 180°], and more preferably [0°, 45°] if the synchronous speed is above the rotation speed of the generator, or in the range [−270°, 0°], preferably [−180°, 0°], and more preferably [−45°, 0°] if the synchronous speed is below the rotation speed of the generator.

According to one embodiment, time $t_2$ is a time for which the rotation speed of the rotor is below 95%, preferably 80%, more preferably below 70%, of the synchronous speed.

According to one embodiment, the torque is adjusted via adjustment of the flow of water.

According to one embodiment, the flow of water is adjusted with wicket gates.

According to one embodiment, the adjustment torque comprises an adjustment of the flow of water running into the runner via an actuator, called first actuator, the first actuator being controlled by a controller, called adjustment controller, and wherein during execution of sub-step a1), the adjustment controller calculates, advantageously in real time, the needed flow of water running into the runner.

According to one embodiment, the adjustment controller get signals provided by sensors adapted for measuring the generator rotation speed and the generator phase.

According to one embodiment, the adjustment controller is further provided with a hydrodynamic based model for the calculation of the needed flow of water running into the runner.

According to one embodiment, the hydrodynamic based model is a hydrodynamic analytical model of the hydraulic turbine.

According to one embodiment, the adjustment controller controls a second actuator adapted for applying an electrical torque on the rotor of the synchronous generator during sub-step a1).

According to one embodiment, the second actuator comprises a variable frequency drive. The variable frequency drive can be a static frequency converter or a voltage source inverter.

According to one embodiment, the second actuator uses a feedback loop for controlling the electrical torque during sub-step a1).

According to one embodiment, the adjustment controller calculates a theoretical trajectory of the rising of the rotor rotation speed.

According to one embodiment, the second actuator controls the electrical torque in real time so that the rising of the rotor rotation speed sticks to the theoretical trajectory.

According to one embodiment, the second actuator is powered by an AC/DC conversion unit coupled with a battery, or a thyristor bridge connected to the grid.

The invention also concerns a computer program for implementing the method of coupling a hydraulic unit to the grid according to the present invention.

BRIEF DESCRIPTION OF THE DRAWINGS

Other characteristics and advantages shall appear in the following description of embodiments of the method for coupling a hydraulic turbine to the grid according to the invention, given by way of non-limiting examples, in reference to the annexed drawings wherein.

DETAILED DESCRIPTION OF SPECIFIC EMBODIMENTS

The present invention proposes a method for coupling a hydraulic unit to the grid in a faster way than known prior art methods. In particular, and contrary to known prior art methods, the method of the present invention proposes to execute simultaneously the generator frequency stabilization and the alignment of the generator phase with the grid phase.

Figure 1:
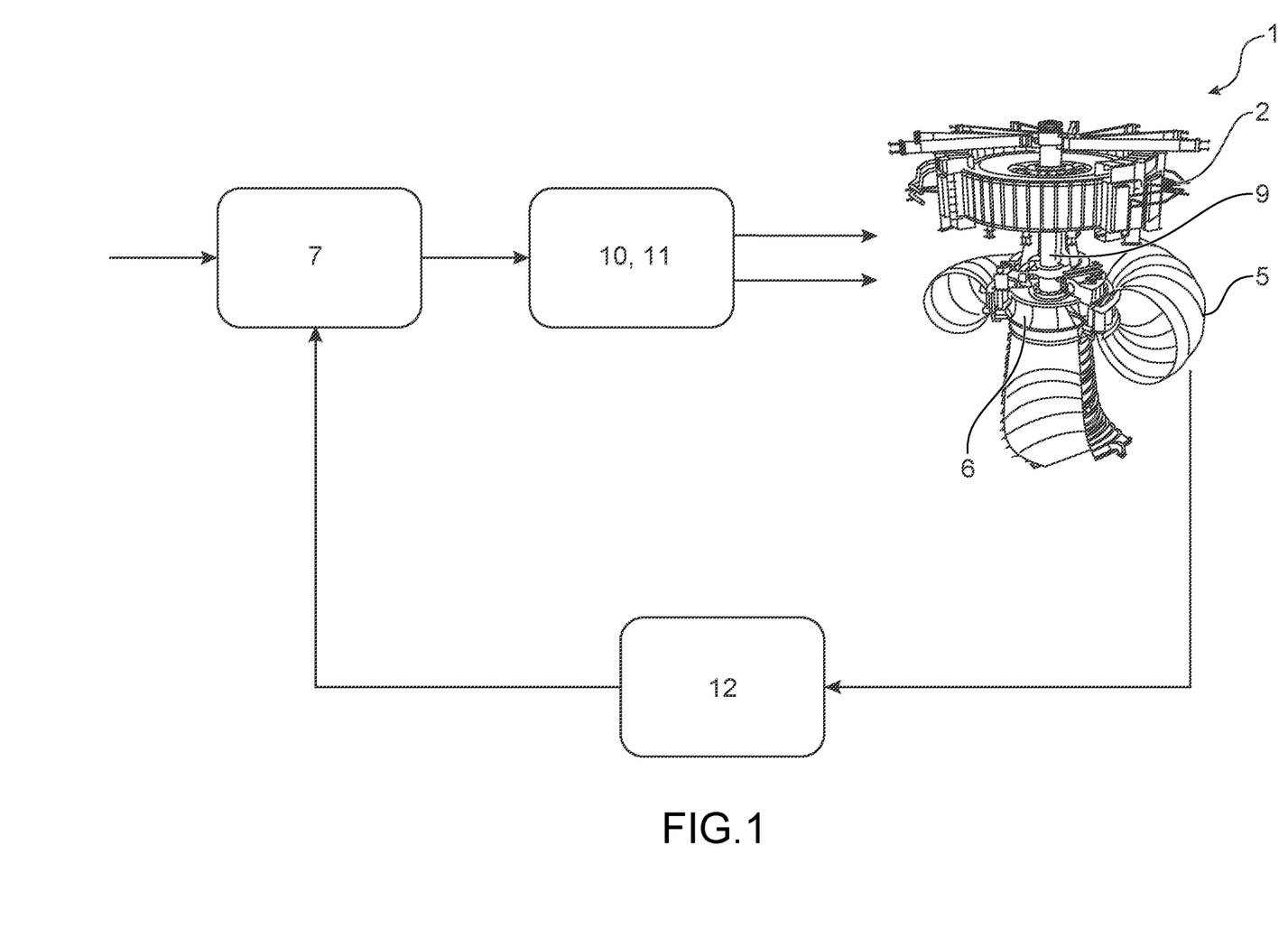
FIG. 1 is a schematic representation of a hydraulic unit according to a first embodiment of the invention involving a controller which controls two actuators and a feedback loop.

FIG. 1 depicts an overall architecture of a hydraulic unit according to the present invention.

Figure 2:
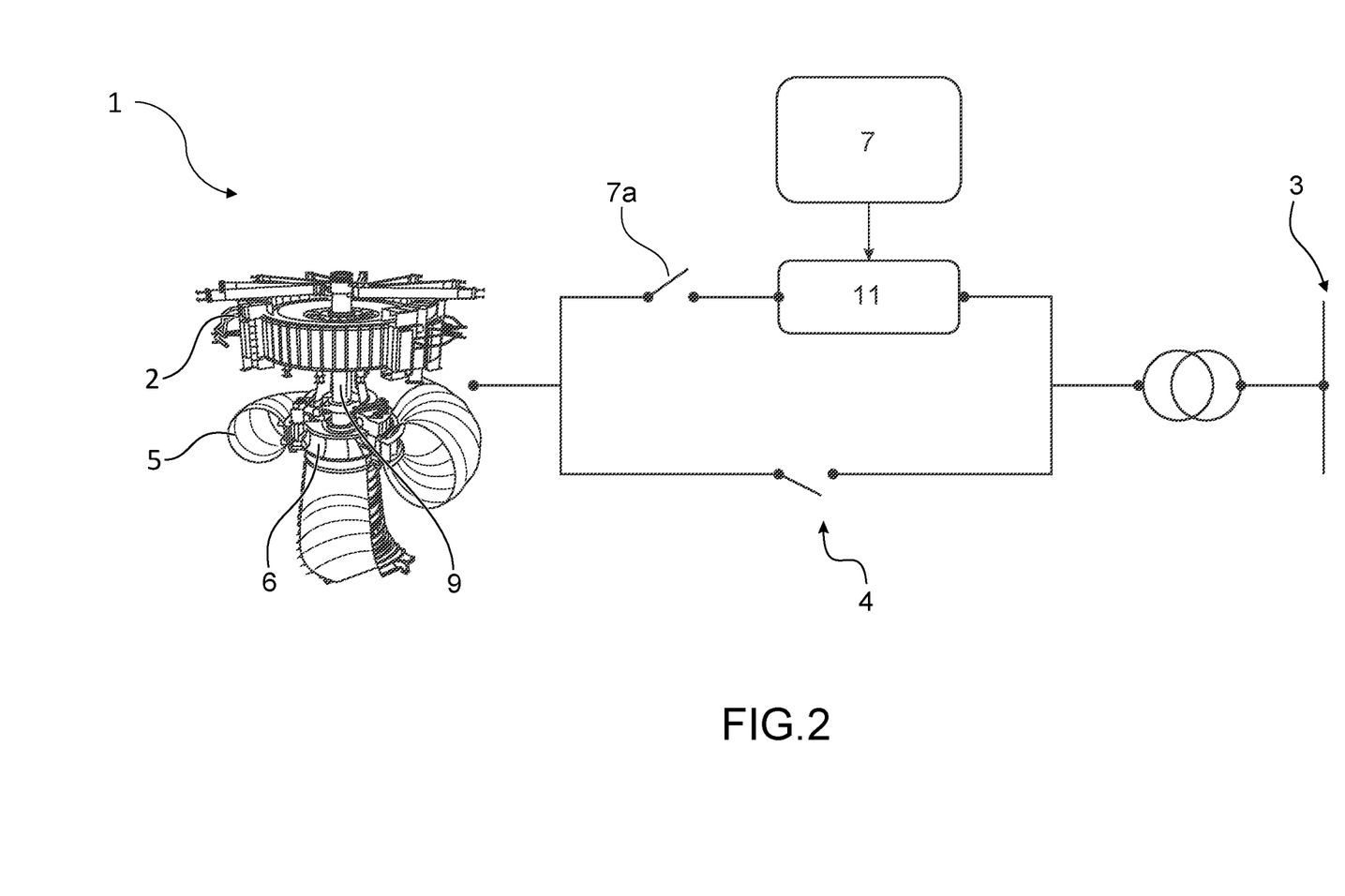
FIG. 2 is a schematic representation of a hydraulic unit according to a first variant of a second embodiment of the invention involving a variable frequency drive fed by the power of the grid.
Figure 3:
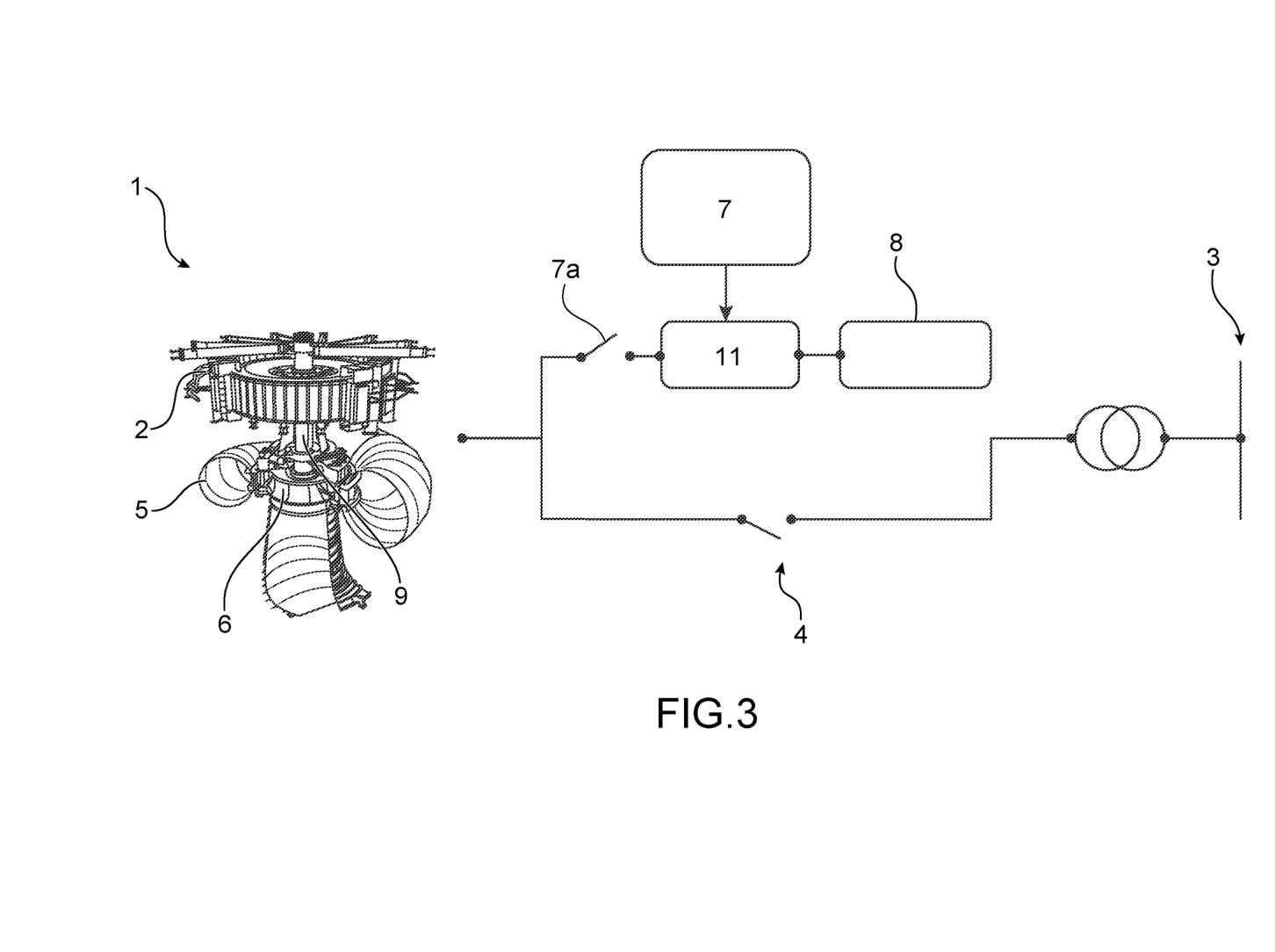
FIG. 3 is another schematic representation of a hydraulic unit according to a second variant of the second embodiment of the invention involving a variable frequency drive fed by a battery.
Figure 4:
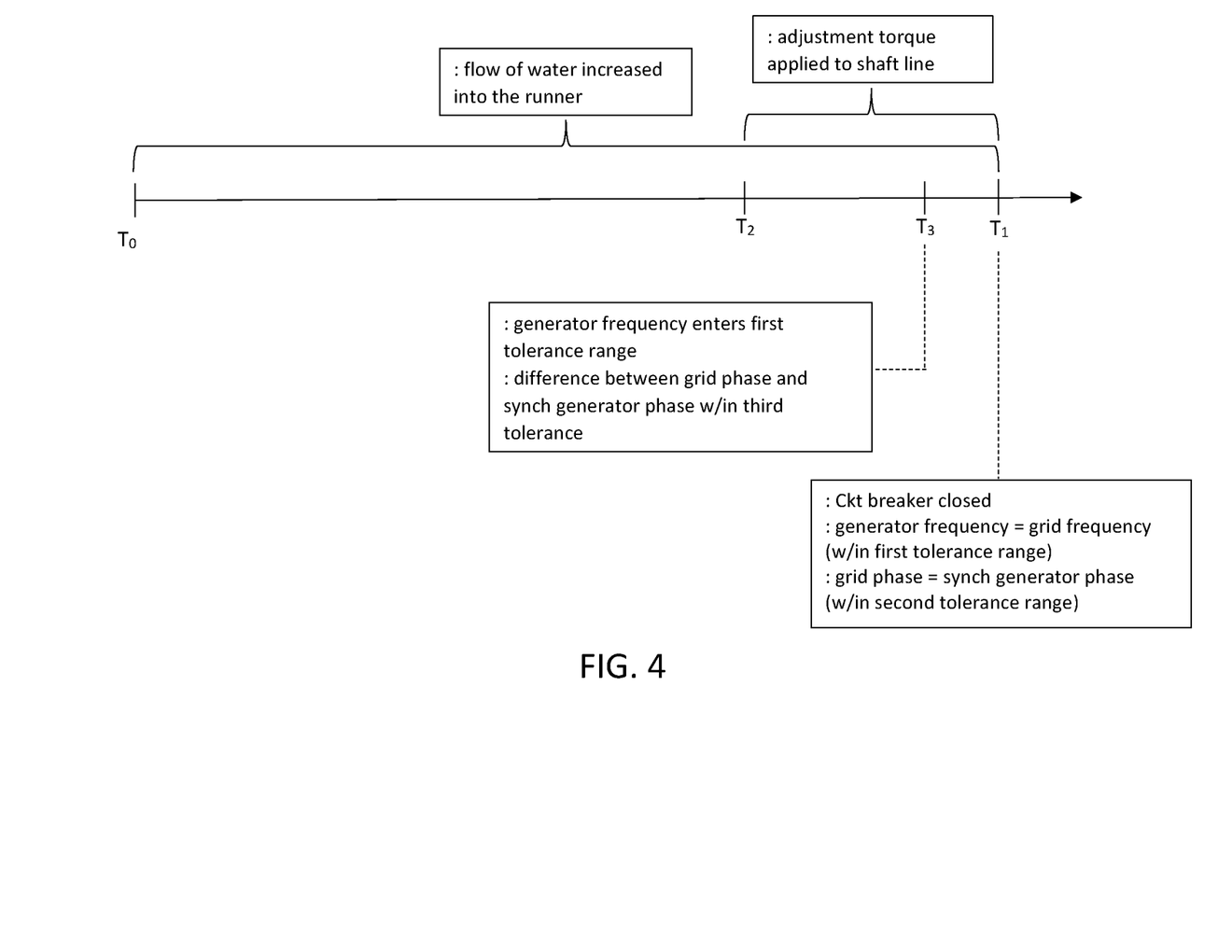
FIG. 4 is a timeline depiction of times t0, t1, t2, and t3 and corresponding events prior to connecting the synchronous generator to the grid at time t1.

The hydraulic unit 1 comprises a synchronous generator 2 connected to a grid 3 via a circuit breaker 4 (displayed in FIGS. 2 and 3).

It is understood that, without it being necessary to specify, the synchronous generator comprises a rotor arranged to rotate inside a stator whose windings are connected to the grid via the circuit breaker.

Furthermore, it is also understood that, without it being necessary to specify, the grid is circulated by an alternative electrical current of frequency called grid frequency, and phase called grid phase.

The present invention, for sake of clarity, is described in the context of a single phase synchronous generator, and can be generalized to a multiple phase (for example a three phases) synchronous generator.

The hydraulic unit 1 further comprises a hydraulic turbine 5 provided with a runner 6 mechanically coupled to the rotor of the synchronous generator 2 via a shaft line 9, so that when rotating, the runner 6 drives into rotation the rotor at the same rotation speed. When coupled to the grid, the rotation speed—called the synchronous speed—of the rotor directly determines the frequency of the electrical voltage delivered to the grid by the synchronous generator via the number of poles of the rotor.

Besides, the hydraulic unit 1 also comprises means for adjusting a torque on the shaft line.

For example, the adjusting means can comprise wicket gates.

The hydraulic unit 1 may also comprise, upstream of the wicket gates, a main inlet valve.

The method for coupling the hydraulic unit to the grid according to the present invention comprises a step a) of increasing the flow of water into the runner from a time $t_0$ to a time $t_1$. At time $t_1$, the circuit breaker may be closed to connect the generator to the grid, $t_1$ being a time for which 2 conditions are met:

1) the rotation speed of the rotor of the synchronous generator is equal to the synchronous speed within a first tolerance interval, and 2) the grid phase and the synchronous generator phase are aligned within a second tolerance interval.

The first tolerance interval is for example an interval of +/−0.5%, preferably 0.2%, centered on the synchronous speed.

The second tolerance interval is for example an interval of +/−20°, +/−10°, preferably +/−5°, and more preferably +/−2°, centered on the grid phase.

At a certain rotation speed, the windings of the rotor can be circulated by an excitation current for energizing the synchronous generator.

The step a) further comprises a sub-step a1) executed from a time $t_2$ to time $t_1$, wherein an adjustment torque is applied to the shaft line so that, at a time $t_3$, for which the generator rotation speed enters for the first time within the first tolerance interval, the difference between the synchronous generator phase and the grid phase, is equal to a predetermined value A within a third tolerance interval.

It is understood that, without it being necessary to specify, that time $t_2$ is comprised in the $[t_0, t_1]$ range.

It is also understood that, without it being necessary to specify, that time $t_3$ is comprised in the $[t_2, t_1]$ range.

Advantageously, if the synchronous speed is above the rotation speed of the generator, A is in the range $[0°, 270°]$, preferably $[0°, 180°]$, and more preferably $[0°, 45°]$.

Advantageously, if the synchronous speed is below the rotation speed of the generator, A is in the range $[-270°, 0°]$, preferably $[-180°, 0°]$, and more preferably $[-45°, 0°]$.

The third tolerance interval is for example an interval of $+/-135°$, $+/-90°$, preferably $+/-22.5°$, and more preferably $+/-10°$, centered on the value of A.

Time $t_2$ is, for example, a time for which the rotation speed of the rotor, called intermediate rotation speed, is below 95%, preferably 80%, more preferably below 70%, of the synchronous speed.

As way of example, the method of coupling the hydraulic turbine to the grid according to the present invention is described below with a predetermined value A equal to zero. This example represents an ideal case.

The hydraulic turbine can comprise a controller, called adjustment controller 7, adapted to control the means for adjusting the torque to the shaft line.

In particular, during execution of sub-step a1), the adjustment controller 7 calculates, advantageously in real time, the adjustment torque to be applied to the shaft line 9.

To do this, the adjustment controller 7 can receive information, like the difference between the generator rotation speed and the synchronous speed or the difference between the generator phase and the grid phase.

Speeds and phases may be measured by sensors. Considering those differences, the adjustment controller 7 can estimate or calculate, via an algorithm, a torque to be applied to the shaft line to adjust the rotation speed rise up of the rotor so that, at time $t_3$, the difference between the phase of the synchronous generator and the grid phase is equal to zero. In this example, $t_1$ occurs at the same time as $t_3$: the rotation speed of the generator and the synchronous speed are within a first tolerance interval of each other while the phases of the grid and of the synchronous generator are aligned within the second tolerance interval. The circuit breaker is closed in order to feed electrical current to the grid.

This ideal case may only be achieved if there is no uncertainty due to the controller 7 and/or of the actuator 11.

If there is some uncertainty due to the controller 7 and/or of the actuator 11, the difference between the phase of the synchronous generator and the phase of the grid may not be strictly equal to zero at time $t_3$. The difference is indeed comprised within the third tolerance interval.

Knowing the third tolerance interval and if the synchronous speed is above the rotation speed of the generator, it may be interesting for the controller to calculate the torque to be applied to the shaft line so that at time $t_3$, the difference between the phase of the generator and those of the grid is always positive despite the uncertainties. For this reason, the value of A is advantageously set to a positive value if the synchronous speed is above the rotation speed of the generator.

Alternatively, if the synchronous speed is below the rotation speed of the generator, the value of A is advantageously set to a negative value.

The optimal value of A is half the length of the third interval, the sign of A depending on the relative position of the generator rotation speed and the synchronous speed.

The consequence of a value A not equal to zero is that $t_1$ occurs a certain time after $t_3$, causing a performance degradation of the time need to couple the hydraulic unit to the grid.

A value A near zero allows a short coupling time. The performances of the invention depends then directly on the third tolerance interval. That is one of the reasons why the accuracy of the controller or those of the actuator that applies the torque on the shaft line must be much higher than those usually used to start hydraulic units.

In one embodiment (FIG. 1), the adjustment torque applied to the shaft line comprises an adjustment of the flow of water running into the runner. In particular, the adjustment of the flow of water comprises the implementation of an algorithm based on an advanced control solution called model predictive control. This model is integrated multiple times over a horizon of typically 10 s during one sample time of the regulator (typically 10 ms) in order to find the best speed/phase trajectory and the corresponding command for the actuator(s). This control strategy is computational resource intensive and it allows to take into account precisely the dynamic behavior of the hydraulic circuit, such as the water hammer in the penstock and to master the speed/phase behavior. Further details regarding the modeling of the hydro generator are given in reference [1] cited at the end of the description.

The adjustment controller 7, via the algorithm, can therefore estimate the optimal opening set point of the wicket gates for achieving sub-step a1). Said estimation of the optimal opening is therefore communicated to an actuator, called first actuator 10, that controls the opening of the wicket gates so that the most appropriate hydraulic torque is applied to the shaft line.

The estimation of the optimal opening set point is advantageously carried out in real time, for example by continuously measuring the rotation speed and the phase of the synchronous generator, and by the use of an extended Kalman filter 12.

The inventors have noticed that, when executing the method according to the invention, the delay between time $t_3$ and time $t_1$ and the predetermined value A are achieved in a repeatable manner from one execution to the other.

In another embodiment (FIGS. 2 and 3), the adjustment controller 7 can impose set points to a second actuator 11. The first actuator 10 controls the opening of the wicket gates, whereas the second actuator 11 can comprise a variable frequency drive coupled to the stator of the synchronous generator.

The variable frequency drive is a power electronics device that provides an electrical torque to the shaft line via the stator windings. The power electronic device can be a static frequency converter or a voltage source inverter.

During sub-step a1), the adjustment controller 7 computes a theoretical trajectory of rotation speed of the generator based on the information of rotation speed and phase of the synchronous generator, so that at time $t_1$ the synchronous generator is synchronized and aligned with the grid. Once the theoretical trajectory has been calculated, the adjustment controller 7 adjusts therefore the set points of the first and the second actuators so that the rotation speed trajectory of the synchronous generator sticks to the theoretical trajectory. This control is advantageously carried out with a feedback loop control to prevent or minimize any deviation from the theoretical trajectory.

The second actuator 11 can comprise an AC/DC conversion unit coupled with a battery 8.

The method according to the present invention further comprises a step b), executed at time $t_1$, of closing the circuit breaker 4 to fed the grid with the current produced by the synchronous generator.

The electrical actuator 11, after closing the circuit breaker, can be disconnected from the hydraulic unit by opening a switch 7a.

In another embodiment, the adjustment controller can impose an appropriate setpoint to both first actuator 10 and second actuator 11.

Therefore, according to the present invention, it is possible to execute both rotation speed synchronization and phase alignment within a single step in order to reduce the time needed to couple the hydraulic unit to the grid.

For example, the inventors have numerically demonstrated that the starting of a hydraulic unit can be reduced from 90 seconds to 60 seconds.

Furthermore, the method according to the present invention does not require the implementation of any additional equipment, and can thus be adapted to existing hydroelectric power plants.

[1] Hugo Mesnage et al., «*Constrained model based control for minimum-time start of hydraulic turbines*», 28$^{th}$ AIRH, Grenoble 2016.

What is claimed is:

1. A method for controlling a hydraulic unit having a synchronous generator to be connected to a grid via a circuit breaker, a hydraulic turbine provided with a runner mechanically coupled to the rotor of the synchronous generator via a shaft line to drive the synchronous generator, and means for adjusting a torque to the shaft line, the method comprises:
   a) a step of adjusting a flow of water into the runner from a time $t_0$ to a time $t_1$; wherein $t_1$ is a time at which rotation speed of the rotor of the synchronous generator is equal to synchronous speed within a first tolerance interval and a grid phase and a synchronous generator phase are aligned within a second tolerance interval,
   b) the time interval from $t_0$ to time $t_1$ comprising a sub-interval from a time $t_2$ to time $t_1$, with $t_0 <= t_2 < t_3 = t_1$, wherein during the sub-interval, a sub-step is executed that comprises applying an adjustment torque, calculated with an adjustment controller, to the shaft line via a first actuator that controls the flow of water into the runner and a second actuator coupled to a stator of the synchronous generator, wherein:
      (1) during the sub-step, adjustment of the generator rotation speed and the synchronous generator phase occurs in parallel via simultaneous control of the first and second actuators;
      (2) at time $t_3$, the generator rotation speed enters for the first time within the first tolerance interval;
      (3) at time $t_3$, a difference between the synchronous generator phase and the grid phase is brought to a predetermined value A within a third tolerance interval; and
      (4) time $t_1$ is the nearest time after $t_3$ for which the grid phase and the synchronous generator phase are aligned within the second tolerance interval;
   c) closing the circuit breaker at time $t_1$.

2. The method according to claim 1, wherein the predetermined value A is in the range 0°-270° if the frequency of the grid is above the frequency of the generator, or in the range −270°-0° if the frequency of the grid is below the frequency of the generator.

3. The method according to claim 1, wherein time $t_2$ is a time for which the rotation frequency of the rotor is below 95% of the grid frequency.

4. The method according to claim 1, wherein the means for adjusting a torque comprise wicket gates.

5. The method according to claim 1, wherein the adjustment torque comprises an adjustment of the flow of water running into the runner via the first actuator controlled by the adjustment controller, and wherein during execution of the sub-step, the adjustment controller calculates the needed flow of water running into the runner.

6. The method according to claim 5, wherein the adjustment controller calculates in real time, the needed flow of water running into the runner.

7. The method according to claim 5, wherein the adjustment controller is communicating with sensors adapted for measuring the generator frequency and the generator phase.

8. The method according to claim 6, wherein the adjustment controller is communicating with sensors adapted for measuring the generator frequency and the generator phase.

9. The method according to claim 5, wherein the adjustment controller is further provided with a hydrodynamic based model for the calculation of the needed flow of water running into the runner.

10. The method according to claim 9, wherein the hydrodynamic based model is a hydrodynamic analytical model of the hydraulic unit that uses a feedback loop that contains a state estimator.

11. The method according to claim 10, wherein the state estimator of the feedback loop is based on an extended Kalman filter.

12. The method according to claim 5, wherein the second actuator is adapted for applying an electrical torque on the rotor of the synchronous generator during the sub-step.

13. The method according to claim 12, wherein the adjustment controller calculates a theoretical trajectory of frequency rising of the rotor.

14. The method according to claim 13, wherein the second actuator controls the electrical torque in real time so that the frequency rising of the rotor sticks to the theoretical trajectory.

15. The method according to claim 12, wherein the second actuator comprises a variable frequency drive.

16. The method according to claim 12, wherein the second actuator uses a feedback loop for controlling the electrical torque during the sub-step.

17. The method according to claim 12, wherein the second actuator is powered by an AC/DC conversion unit coupled with a battery, or a thyristor bridge connected to the grid.

18. A computer program for implementing the method according to claim 1.

* * * * *

UNITED STATES PATENT AND TRADEMARK OFFICE
CERTIFICATE OF CORRECTION

PATENT NO. : 11,581,743 B2
APPLICATION NO. : 17/465255
DATED : February 14, 2023
INVENTOR(S) : Renaud Guillaume, Quentin Alloin and Olivier Teller It is certified that error appears in the above-identified patent and that said Letters Patent is hereby corrected as shown below:

In the Claims

Column 7 Line 34 Please amend Claim 1 to read as follows:
1. A method for controlling a hydraulic unit having a synchronous generator to be connected to a grid via a circuit breaker, a hydraulic turbine provided with a runner mechanically coupled to the rotor of the synchronous generator via a shaft line to drive the synchronous generator, and means for adjusting a torque to the shaft line, the method comprises:
a) a step of adjusting a flow of water into the runner from a time $t_0$ to a time $t_1$; wherein $t_1$ is a time at which rotation speed of the rotor of the synchronous generator is equal to synchronous speed within a first tolerance interval and a grid phase and a synchronous generator phase are aligned within a second tolerance interval,
b) the time interval from $t_0$ to time $t_1$ comprising a sub-interval from a time $t_2$ to time $t_1$, with $t_0 <= t_2 < t_3 <= t_1$, wherein during the sub-interval a sub-step is executed that comprises applying an adjustment torque, calculated with an adjustment controller, to the shaft line via a first actuator that controls the flow of water into the runner and a second actuator coupled to a stator of the synchronous generator, wherein:
(1) during the sub-step, adjustment of the generator rotation speed and the synchronous generator phase occurs in parallel via simultaneous control of the first and second actuators;
(2) at time $t_3$, the generator rotation speed enters for the first time within the first tolerance interval;
(3) at time $t_3$, a difference between the synchronous generator phase and the grid phase is brought to a predetermined value A within a third tolerance interval; and
(4) time $t_1$ is the nearest time after $t_3$ for which the grid phase and the synchronous generator phase are aligned within the second tolerance interval;
c) closing the circuit breaker at time $t_1$.

Signed and Sealed this
Twenty-eighth Day of March, 2023

Katherine Kelly Vidal
*Director of the United States Patent and Trademark Office*